(12) United States Patent
Finis et al.

(10) Patent No.: US 11,121,546 B2
(45) Date of Patent: Sep. 14, 2021

(54) PROTECTION ENSEMBLE

(71) Applicant: PHOENIX CONTACT GMBH & CO KG, Blomberg (DE)

(72) Inventors: Gernot Finis, Kassel (DE); Mario Stolzenberg, Detmold (DE)

(73) Assignee: PHOENIX CONTACT GMBH & CO KG, Blomberg (DE)

( * ) Notice: Subject to any disclaimer, the term of this patent is extended or adjusted under 35 U.S.C. 154(b) by 38 days.

(21) Appl. No.: 16/665,590

(22) Filed: Oct. 28, 2019

(65) Prior Publication Data
US 2020/0136378 A1    Apr. 30, 2020

(30) Foreign Application Priority Data
Oct. 29, 2018  (DE) .......................... 102018218461.5

(51) Int. Cl.
*H02H 9/04*   (2006.01)
*H01C 7/12*   (2006.01)
*H02H 3/08*   (2006.01)
*H05K 1/02*   (2006.01)
*H01H 85/00*  (2006.01)

(52) U.S. Cl.
CPC ................ *H02H 9/04* (2013.01); *H01C 7/12* (2013.01); *H01H 85/00* (2013.01); *H02H 3/085* (2013.01); *H05K 1/02* (2013.01); *H05K 2201/10181* (2013.01)

(58) Field of Classification Search
CPC ............... H02H 9/04–045; H01C 7/12; H05K 2201/10181; H01T 4/00–20
See application file for complete search history.

(56) References Cited

U.S. PATENT DOCUMENTS

| 7,511,933 B2* | 3/2009 | Hartman ................. H02H 9/042 |
| | | 361/111 |
| 2017/0324195 A1 | 11/2017 | Eriksen et al. |
| 2018/0233897 A1 | 8/2018 | Pelegris et al. |
| 2019/0372332 A1* | 12/2019 | Khosla ................... H01H 71/12 |
| 2020/0035460 A1* | 1/2020 | Benjamin .............. H02H 9/041 |

FOREIGN PATENT DOCUMENTS

| DE | 4220259 | 1/1994 |
| EP | 2513942 | 3/2014 |
| IN | 201611023852 | * 7/2016 |

OTHER PUBLICATIONS

Official Action for German Patent Application No. 102018218461.5, dated Jul. 10, 2019, 6 pages.

* cited by examiner

*Primary Examiner* — Jared Fureman
*Assistant Examiner* — Christopher J Clark
(74) *Attorney, Agent, or Firm* — Sheridan Ross P.C.

(57) ABSTRACT

The invention relates to a protection ensemble, comprising
a circuit breaker, and
a surge protector device,
wherein the circuit breaker and the surge protector device have an interface,
wherein the surge protector device comprises a monitoring device and, upon recognizing a fault condition by the monitoring device, the circuit breaker can be tripped by means of the interface.

8 Claims, 2 Drawing Sheets

PROTECTION ENSEMBLE

CROSS-REFERENCE TO RELATED APPLICATION

This application claims the benefit of German Patent Application No. DE 102018218461.5 filed Oct. 29, 2018, the entire contents of which are incorporated herein by reference.

The invention relates to a protection ensemble.

BACKGROUND OF THE INVENTION

Electrical installations are endangered by voltage surges. Therefore, to an increasing extent, surge protector devices are being installed in electrical installations in order to increase their availability.

For a good protective effect, it is important to adapt the surge protector devices as accurately as possible to the properties of the installation being protected, or its system. A typical parameter here is the protection level. Another typical parameter is the discharge capacity. Each of these parameters alone may represent a protection goal for any given installation to be protected and/or for a component to be protected. Generally, threat parameters and/or the electrical strength of an installation form the basis in determining the protection goal.

If, for example, a power supply, a circuit breaker and a surge protector device are arranged in an electrical installation, then for its protection (and for the protection of the consumers supplied by it) the surge protector device must be chosen suitably in order to protect the power supply and/or the circuit breaker and/or the consumers supplied. In particular, a surge protector device itself requires a coordinated overcurrent protection device in order to safely disconnect it from the power grid in event of a fault in the surge protector device itself.

Especially in the direct current voltage realm, many different systems can be found whose power supply in particular has very different source characteristics.

As an illustration, classical direct current sources have a rather linear behavior in the current/voltage characteristic, while photovoltaic systems for example have a different behavior. Therefore, the breaking power for example of the voltage surge protection in a photovoltaic system must be able to switch far higher power than in other direct current voltage applications, since the power which needs to be disconnected in the event of a fault is much higher in the case of a photovoltaic characteristic than for a classic direct current source. That is, the breaking capacity must be suitable to the highly dynamic direct current source characteristic. The breaking power of the voltage surge protection in a photovoltaic installation must be approximately twice as high as in an installation with a classic direct current source. Furthermore, in many nonlinear sources the operating current is often only insignificantly less than the specified short circuit current. That is, a meaningful choice is only possible in narrow limits and with little tolerance.

Various methods of fault handling, such as disconnection devices, have been developed for the case when a surge protector device permanently adopts a low-resistance state on account of aging or a fault. These disconnection devices are only coordinated with the surge protection device.

Surge protection devices for use in low-voltage power supply systems (according to DIN EN 61643-11:2013-04; VDE 0675-6-11:2013-04) are generally equipped with integrated thermal disconnecting devices or melting fuses, which provide a galvanic disconnection of the surge protection device from the voltage supply system in case of a load-related aging of the active protection elements (such as a varistor), before it goes beyond a critical temperature and represents a danger.

Thus far, such surge protection devices have not made much of an inroad into high-energy systems of measuring, controlling and regulating applications (according to DIN EN 61643-21:2013-07; VDE 0845-3-1:2013-07)—especially in systems with high operating voltages and/or large short-circuit powers.

In these systems, it is difficult to manage fault currents which may result in a critical heating of the surge protector device. This is especially true when the source characteristic of the power supply is unknown. For example, if a possible short circuit source is not reliably predictable, no suitable safety means can be chosen, since a safety means is typically chosen such that a fault current is only slightly higher than the minimum triggering current of the safety means.

Starting from this background, the problem which the invention proposes to solve is to provide an improvement in accomplishing protection goals.

The problem is solved by protection ensembles according to the independent claims. Further advantageous embodiments are the subject matter in particular of the dependent claims.

The invention shall be explained more closely in the following, making reference to the figures.

DETAILED DESCRIPTION

Figure 1:
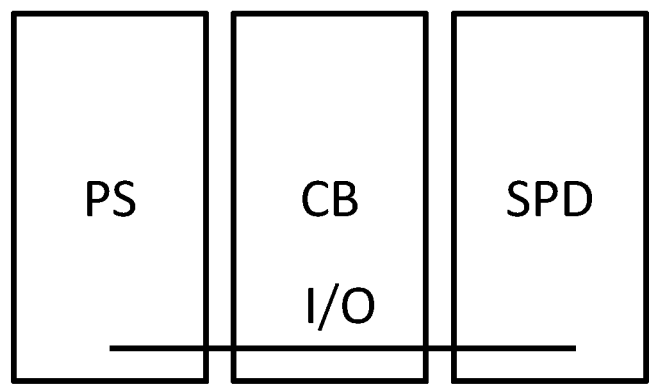
FIG. 1 shows a schematic representation of a first protection ensemble according to the invention.

The invention shall be represented in the following with reference to FIG. 1-3. It should be noted that different aspects shall be described, each of which may be used alone or in combination. That is, any aspect may be used with different embodiments of the invention, unless explicitly presented as a pure alternative.

Furthermore, for the sake of simplicity, generally only one entity shall be referred to in the following. But, unless specifically stated, the invention may also have several of the mentioned entities. Accordingly, the use of the word "a" or "an" should only be taken to mean that at least one entity is used in a simple embodiment.

So far as methods are described in the following, the individual steps of a method may be arranged and/or combined in any given sequence, as long as the context does not indicate otherwise. Furthermore, the methods may be combined with each other, as long as not explicitly indicated otherwise.

Indications with numerical values should generally not be taken as exact values, but rather also contain a tolerance of +/−1% to +/−10%.

Reference to standards or specifications or norms should be understood as being a reference to standards or specifications or norms that are or were in effect at the date of the application and/or—if a priority is claimed—at the date of the priority application. However, this does not generally rule out an applicability to subsequent or substituting standards or specifications or norms.

"Adjacent" explicitly includes in the following a direct neighboring relationship, but without being confined to this. "Between" explicitly includes in the following a position in which the intermediate part has a direct adjacency to the surrounding parts.

As a preliminary remark, it should be noted that the previous approaches have been applied at the level of an individual element.

On the other hand, the invention follows a systematic approach in managing a fault or a malfunction.

In a first embodiment of the invention—which is explained in connection with FIG. 1—a protection ensemble 1 comprises a circuit breaker CB and a surge protector device SPD.

The circuit breaker CB and the surge protector device SPD each have an interface I/O. This is represented in the figures as a solid line, in order to indicate a possible expansion of the communicating devices (not conclusively).

The surge protector device SPD may furthermore comprise in all embodiments a monitoring device S1, S2, wherein upon recognizing a fault condition by the monitoring device S1, S2 the circuit breaker CB can be tripped by means of the interface I/O.

That is, unlike previous approaches based on an independent disconnection, as an alternative or in addition there is now a coordinated disconnection by an upstream connected circuit breaker CB, so that the surge protector device SPD and/or the power supply PS and/or downstream connected consumers are protected against the consequences of a short circuit, e.g., by malfunctioning of the surge protector device SPD and/or by resulting currents of the surge protector device SPD.

Now, if the monitoring device S1, S2 detects a malfunction of the surge protector device SPD, a digital or analog signal can be provided by means of the interface I/O which indicates this fault via the interface I/O.

The circuit breaker CB can then trigger the disconnection (by itself) on the basis of the malfunction reported via the interface I/O.

Depending on the design, the circuit breaker may respond in the manner of a command and/or, after an evaluation of the digital or analog signal received from the interface I/O, produce the disconnection by itself. For example, it would be possible for the monitoring device S1, S2 to identify different faults and report them differently by means of the interface I/O. Faults may also be the crossing or reaching of a threshold value, for example.

Figure 3:
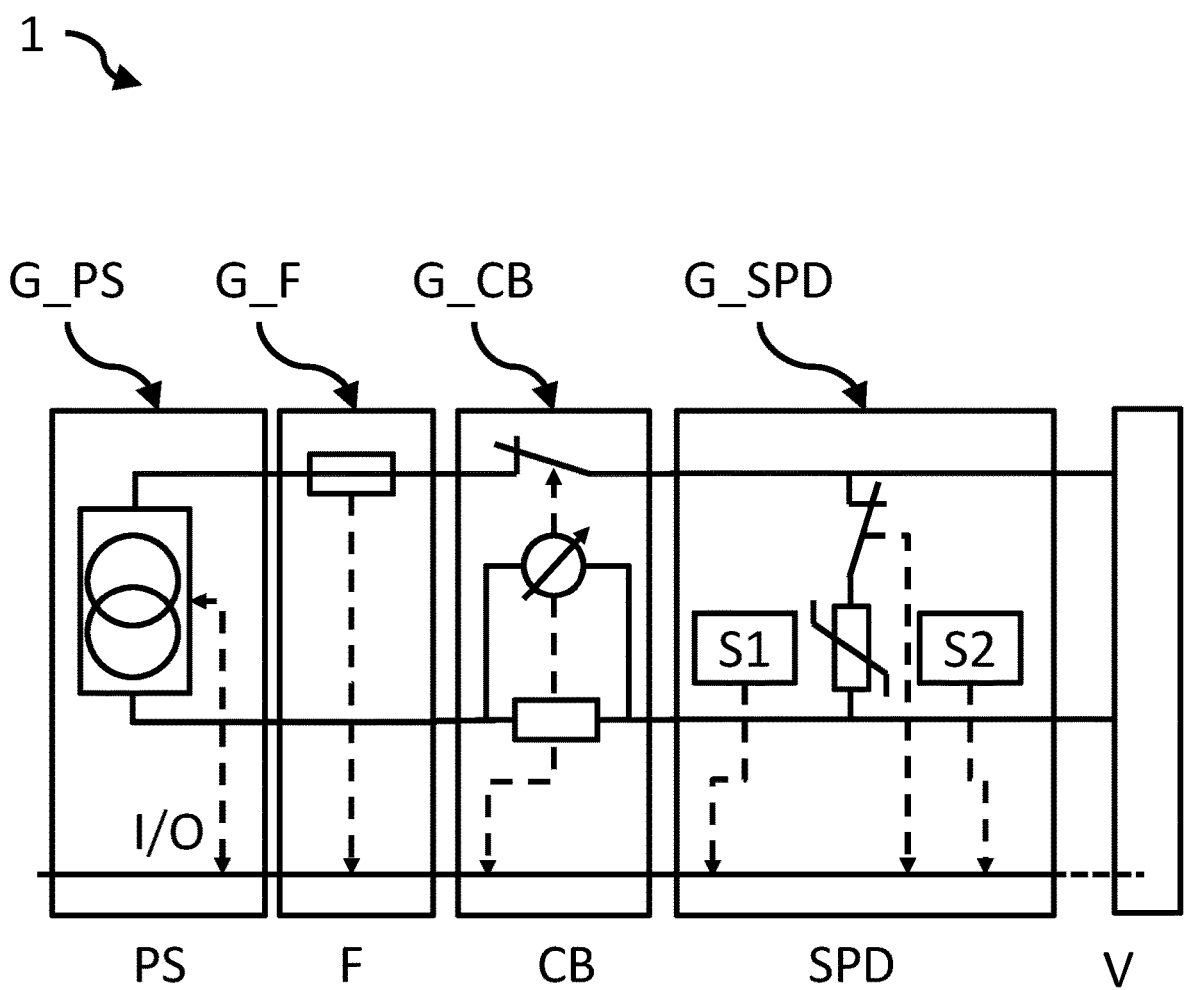
FIG. 3 shows a schematic representation of a third protection ensemble according to the invention.

In one embodiment, the circuit breaker CB—as indicated in FIG. 3—is arranged in an independent housing G_CB. Alternatively, the circuit breaker CB may also be integrated in a power supply PS. Naturally, it may also be provided that an independent circuit breaker CB is also provided, even though the power supply PS already has a circuit breaker. Without limiting the generality, a circuit breaker CB could also be arranged in a housing G_SPD.

In embodiments of the invention, it may furthermore be provided that the circuit breaker (CB) can only be reactivated after recognizing a replacement of the (defective) surge protector device SPD.

This may be advantageous, e.g., if the surge protector device SPD is irreversibly damaged and/or a predetermined protective action is no longer given or no longer anticipated, e.g., after a certain number of surge arresting events.

For example, by monitoring of the interface I/O a mechanical removal and resetting of a surge protector devices SPD can then be detected. Alternatively or additionally, however, distinct data may also be read out from the surge protector device SPD via the interface I/O or be provided by this surge protector device SPD, so that other elements of the protection ensemble 1 can recognize the replacement, and then make possible a reactivation of the protection ensemble 1.

In another embodiment of the invention—which is explained in connection with FIG. 2—the protection ensemble 1 comprises a power supply PS, a thermal fuse F, and a surge protector device SPD.

The power supply PS and the surge protector device SPD may in turn have an interface I/O.

The surge protector device SPD comprises a monitoring device S1, S2, wherein upon recognizing a fault condition by the monitoring device S1, S2 the power supply (PS) can produce a brief current surge by means of the interface I/O so that the thermal fuse F is disconnected. The current surge can be actively chosen so that the current surge securely disconnects the thermal fuse F.

In another embodiment of the invention, which will likewise be explained in connection with FIG. 2—the protection ensemble 1 comprises a power supply PS and a surge protector device SPD.

The power supply PS and the surge protector device SPD may in turn have an interface I/O.

The surge protector device SPD comprises a monitoring device S1, S2, wherein upon recognizing a fault condition by the monitoring device S1, S2 the power supply PS can be disconnected by means of the interface I/O.

That is, unlike previous approaches based on an independent disconnection, as an alternative or in addition there is now a coordinated disconnection by the power supply PS and the upstream connected thermal fuse F, so that the surge protector device SPD and/or the power supply PS and/or downstream connected consumers are protected against the consequences of a short circuit, e.g., due to malfunctioning of the surge protector device SPD and/or by resulting currents of the surge protector device SPD. Consequences of a fault current are, e.g., a fire hazard, which may have effects on adjacent devices such as the power supply PS and/or the consumers, and/or the loss of availability of the consumer, since in the event of a short circuit the power supply of the consumer is no longer assured.

Now, if the monitoring device S1, S2 detects a malfunction of the surge protector device SPD, a digital or analog signal can be provided by means of the interface I/O, indicating this fault via the interface I/O.

The power supply PS can then trigger the disconnection indirectly by increasing the current provided on the basis of the malfunction reported via the interface I/O. This increased current, depending on its magnitude, results in a (rapid) triggering of the thermal fuse F. That is, the thermal fuse F is specifically triggered.

Depending on the design, the power supply PS may respond in the manner of a command and/or, after an evaluation of the digital or analog signal received from the interface I/O, trigger the disconnection by itself. For example, it would be possible for the monitoring device S1, S2 to identify different faults and report them differently by means of the interface I/O.

In one embodiment, the power supply PS—as indicated in FIG. 3—is arranged in an independent housing G_PS. Alternatively, the power supply PS may also comprise an integrated circuit breaker CB and/or a thermal fuse F.

In all embodiments of the invention, the monitoring device may comprise a thermal monitoring device S1 and/or a fault arc monitoring device S2. Thermal monitoring devices S1 may comprise thermal sensors, such as PT100, infrared sensors, thermally variable resistors or semiconductors, etc. and their evaluation circuits (measurement bridges, differential amplifiers, comparators, etc.), or solder-based disconnection devices, having reporting elements. Fault arc monitoring devices S2 may comprise, e.g., photosensitive elements such as photoresistors or photosemiconductors, etc., and their evaluation circuits (measurement bridges, differential amplifiers, comparators, etc.).

In one embodiment, the surge protector device SPD—as indicated in FIG. 3—is arranged in an independent housing G_SPD. Alternatively, the surge protector device SPD may also be integrated in a circuit breaker CB and/or a thermal fuse F and/or a power supply PS.

In all embodiments of the invention, the interface I/O may be a wired interface or wireless interface. Wired interfaces are to be understood as being electrically conductive connections, wherein an electrical connection can be produced between individual elements e.g. by contacts on the side or on the floor (e.g., to a bus board). Alternatively or additionally, it may also be provided that an electrical connection can be produced by means of wires or jumpers, as in modular terminal systems. Wireless interfaces are preferable from the domain of near-field communication, such as Bluetooth. Bluetooth-LowEnergy, WLAN, ZigBee, and optical systems, but without being limited to these.

It should be noted that, in the most general form, a mechanical interface I/O may also be provided as an operative connection.

In particular, it may be provided in all embodiments of the invention that the interface I/O also enables the exchanging of configuration data within the protection ensemble. Thus, e.g., power data can be exchanged, so that a coordinated disconnection in the event of a fault is made possible. For example, state data may also be provided by the circuit breaker CB via the interface I/O, such as information about the surge protector device SPD having been disconnected and/or a breaking on the part of the circuit breaker CB and/or a current flow/triggered current pulse to disconnect a thermal fuse F. All the data may also be provided to other devices for further processing.

For example, in such a protection ensemble 1 the power supply PS can recognize whether a backup fuse F is present and/or whether a circuit breaker CB is present. Depending on the situation discovered, the circuit breaker CB and/or the power supply PS can then produce a necessary disconnection in a way suitable to the circumstances. For example, if a thermal fuse F is present, the power supply PS can provide the necessary current surge to trigger the thermal fuse F. If a circuit breaker CB is present, for example, the circuit breaker CB can then produce the disconnection. If both a circuit breaker CB and a thermal fuse F are present, as well as a power supply PS according to the invention, then a coordinated procedure can be made possible for example using power data of the power supply PS and/or the circuit breaker CB and/or the thermal fuse F, as well as the power data of the surge protector device SPD.

This coordinated procedure may be controlled, e.g., by one of the elements. For example, a coordination can be performed by the surge protector device SPD.

Without limiting generality, the interface I/O can also provide state data and/or configuration data of the elements of the protection ensemble to external devices. Thus, e.g., a remote monitoring can be realized.

Alternatively or additionally, it would also be possible to set up a particular behavior, including by user intervention—whether on one of the elements of the protection ensemble, or via the interface I/O.

The elements of the proposed protection ensemble can be mounted by means of corresponding fastening devices on a carrier rail. The fastening devices may also be designed for wall mounting and/or a crossboard current distribution system.

In particular, the elements of the proposed protection ensemble may comprise electrical interface I/Os arranged on the side in the respective housings, which can produce electrical contact connections between respectively adjacent elements when mounted on a carrier rail, so that a protection bus system can be constructed.

Summarizing, the idea of the invention can be characterized as a systemic approach. It makes it possible for the installed elements of the protection ensemble to communicate with each other and to utilize the respective functions of another element to accomplish a protection goal, so that malfunctions are minimized and/or faulty behavior and/or faulty configuration can be avoided as much as possible.

That is, for example, the circuit breaker CB as well as the surge protector device SPD can form a systemic unit (FIG. 1). Both elements can communicate via the interface I/O (one-way communication/two-way communication).

Now if, for example, a predefined temperature is reached or exceeded, and/or if a predefined leakage current is exceeded and/or a consequent current is detected and/or the triggering of a disconnection device and/or a fault arcing is detected, the surge protector device SPD can send/provide corresponding information/commands by means of the interface I/O to the circuit breaker CB. The circuit breaker CB will interrupt the current flow by separating the power supply PS from the defective system and places the protection ensemble 1 in a secure state. This approach enables, in certain circumstances, the total elimination of a disconnection device integrated in the surge protector device SPD, since the circuit breaker CB can operate as a thermally activated disconnection device or one triggered by a fault current.

Likewise, it would be possible to detect the triggering of a thermal disconnection device by means of a monitoring device in the surge protector device SPD. Various means can be provided for this, such as a mechanical and/or an optical and/or electrical monitoring. The information about the detected triggering of the thermal disconnection device may be relayed via the interface to the circuit breaker CB. The circuit breaker CB may then disconnect the current flow (additionally) by disconnecting the power supply PS from the defective system. This redundancy affords the benefit that the circuit breaker CB can produce the safe condition in the event of exceeding the switching ability of a disconnection device integrated in the surge protector device SPD.

Figure 2:
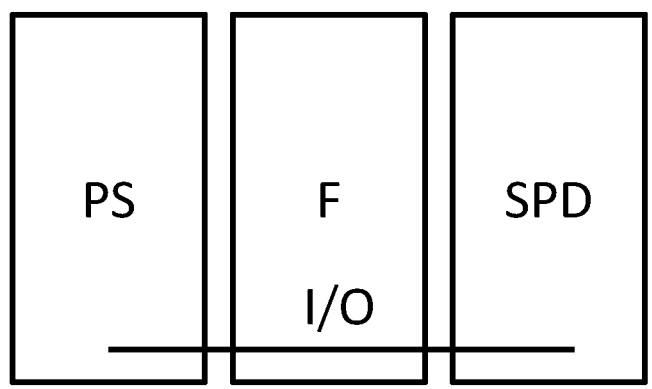
FIG. 2 shows a schematic representation of a second protection ensemble according to the invention.

Likewise, for example, the power supply PS as well as the surge protector device SPD may form a systemic unit (FIG. 2). Both elements may communicate via the interface I/O (one-way communication/two-way communication).

If, now, a predefined temperature is reached or exceeded, for example, and/or if a predefined leakage current is exceeded and/or a consequent current is detected and/or the triggering of a disconnection device and/or a fault arcing is detected, the surge protector device SPD can send/provide corresponding information/commands by means of the interface I/O to the power supply PS. The power supply PS will indirectly interrupt the current flow by ordering the switching of a thermal fuse F (by means of a current pulse), thus resulting in separating of the power supply PS from the defective system and placing the protection ensemble 1 in a safe state. This approach enables, in certain circumstances, the total elimination of a disconnection device integrated in the surge protector device SPD, since the circuit breaker CB or the power supply PS can operate as a thermally activated disconnection device or one triggered by a fault current.

LIST OF REFERENCES

1 Protection ensemble
CB Circuit breaker
SPD Surge protector device
I/O Interface
G_CB Housing
M Mounting rail
PS Power supply
F Thermal fuse
G_PS Housing
S1, S2 Monitoring device
G_SPD Housing

The invention claimed is:
1. A protection ensemble, comprising:
a power supply;
a thermal fuse;
a surge protector device; and
an interface in communication with the power supply and the surge protector device,
wherein the surge protector device comprises a monitoring device, and upon recognizing a fault condition by the monitoring device the power supply produces a brief current surge after receiving a signal via the interface so that the thermal fuse is disconnected.

2. The protection ensemble according to claim 1, wherein the power supply is arranged in an independent housing.

3. The protection ensemble according to claim 1, wherein the power supply comprises fastening devices for a mounting rail.

4. The protection ensemble according to claim 1, wherein the monitoring device comprises a thermal monitoring device and/or a fault arc monitoring device.

5. The protection ensemble according to claim 1, wherein the surge protector device is arranged in an independent housing.

6. The protection ensemble according to claim 1, wherein the interface is a wired interface or a wireless interface.

7. The protection ensemble according to claim 1, wherein the interface enables the exchanging of configuration data within the protection ensemble.

8. The protection ensemble according to claim 1, wherein the interface provides state data and/or configuration data to external devices.

* * * * *